(12) United States Patent
Morita et al.

(10) Patent No.: US 9,331,457 B2
(45) Date of Patent: May 3, 2016

(54) SEMICONDUCTOR LASER APPARATUS

(71) Applicant: MITSUBISHI ELECTRIC CORPORATION, Chiyoda-ku (JP)

(72) Inventors: Daiji Morita, Chiyoda-ku (JP);
Tomotaka Katsura, Chiyoda-ku (JP);
Susumu Konno, Chiyoda-ku (JP);
Shuichi Fujikawa, Chiyoda-ku (JP);
Satoshi Nishida, Chiyoda-ku (JP); Kenji Kumamoto, Chiyoda-ku (JP); Naoki Miyamoto, Chiyoda-ku (JP); Hiroaki Kurokawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/441,091

(22) PCT Filed: Oct. 1, 2013

(86) PCT No.: PCT/JP2013/076681
§ 371 (c)(1),
(2) Date: May 6, 2015

(87) PCT Pub. No.: WO2014/087726
PCT Pub. Date: Jun. 12, 2014

(65) Prior Publication Data
US 2015/0303656 A1    Oct. 22, 2015

(30) Foreign Application Priority Data

Dec. 3, 2012  (JP) .................. 2012-263980

(51) Int. Cl.
*H01S 5/40* (2006.01)
*H01S 5/14* (2006.01)
(Continued)

(52) U.S. Cl.
CPC ............... *H01S 5/4062* (2013.01); *G02B 3/06* (2013.01); *G02B 19/0014* (2013.01);
(Continued)

(58) Field of Classification Search
CPC ... H01S 5/4062; H01S 5/4087; H01S 5/4012; H01S 5/143; G02B 27/14; G02B 27/4233; G02B 3/06
See application file for complete search history.

(56) References Cited

U.S. PATENT DOCUMENTS 6,192,062 B1   2/2001   Sanchez-Rubio et al.
6,529,542 B1   3/2003   Karlsen et al.
(Continued)

FOREIGN PATENT DOCUMENTS

JP   2013 521666   6/2013
JP   2013 521667   6/2013
(Continued)

OTHER PUBLICATIONS

Hamilton, et al., "High Power Laser Source with Spectrally Beam Combined Diode Laser Bars", Proceedings of SPIE, vol. 5336, (Jan. 1, 2004), pp. 1-10.
(Continued)

*Primary Examiner* — Armando Rodriguez
(74) *Attorney, Agent, or Firm* — Oblon, McClelland, Maier & Neustadt, L.L.P.

(57) ABSTRACT

A semiconductor laser apparatus, including: a beam divergence angle correction optical system for correcting a divergence angle of beams generated from light emitting points of a semiconductor laser bar; a beam rotation optical system for rotating the beams each having the corrected divergence angle; a wavelength dispersion optical element having a wavelength dispersion function; and a partial reflection mirror. A relative position of the beam divergence angle correction optical system with respect to the light emitting point in a divergence angle correction direction is changed for each light emitting point.

12 Claims, 12 Drawing Sheets

(51) Int. Cl.
*G02B 19/00* (2006.01)
*G02B 27/10* (2006.01)
*G02B 27/12* (2006.01)
*H01S 5/022* (2006.01)
*G02B 3/06* (2006.01)
*G02B 27/14* (2006.01)
*G02B 27/42* (2006.01)

(52) U.S. Cl.
CPC ........... *G02B 19/0057* (2013.01); *G02B 27/10* (2013.01); *G02B 27/1006* (2013.01); *G02B 27/1086* (2013.01); *G02B 27/126* (2013.01); *G02B 27/14* (2013.01); *G02B 27/4233* (2013.01); *H01S 5/022* (2013.01); *H01S 5/14* (2013.01); *H01S 5/143* (2013.01); *H01S 5/40* (2013.01); *H01S 5/4012* (2013.01); *H01S 5/4087* (2013.01)

(56) References Cited

U.S. PATENT DOCUMENTS

| | | |
|---|---|---|
| 2007/0002925 A1 | 1/2007 | Zediker et al. |
| 2011/0216417 A1 | 9/2011 | Chann et al. |
| 2011/0216792 A1 | 9/2011 | Chann et al. |
| 2012/0281293 A1 | 11/2012 | Gronenborn et al. |

FOREIGN PATENT DOCUMENTS

| | | |
|---|---|---|
| WO | 2006 045303 | 5/2006 |
| WO | 2011 021140 | 2/2011 |
| WO | 2011 109760 | 9/2011 |
| WO | 2011 109763 | 9/2011 |

OTHER PUBLICATIONS

International Search Report Issued Dec. 17, 2013 in PCT/JP13/076681 Filed Oct. 1, 2013.

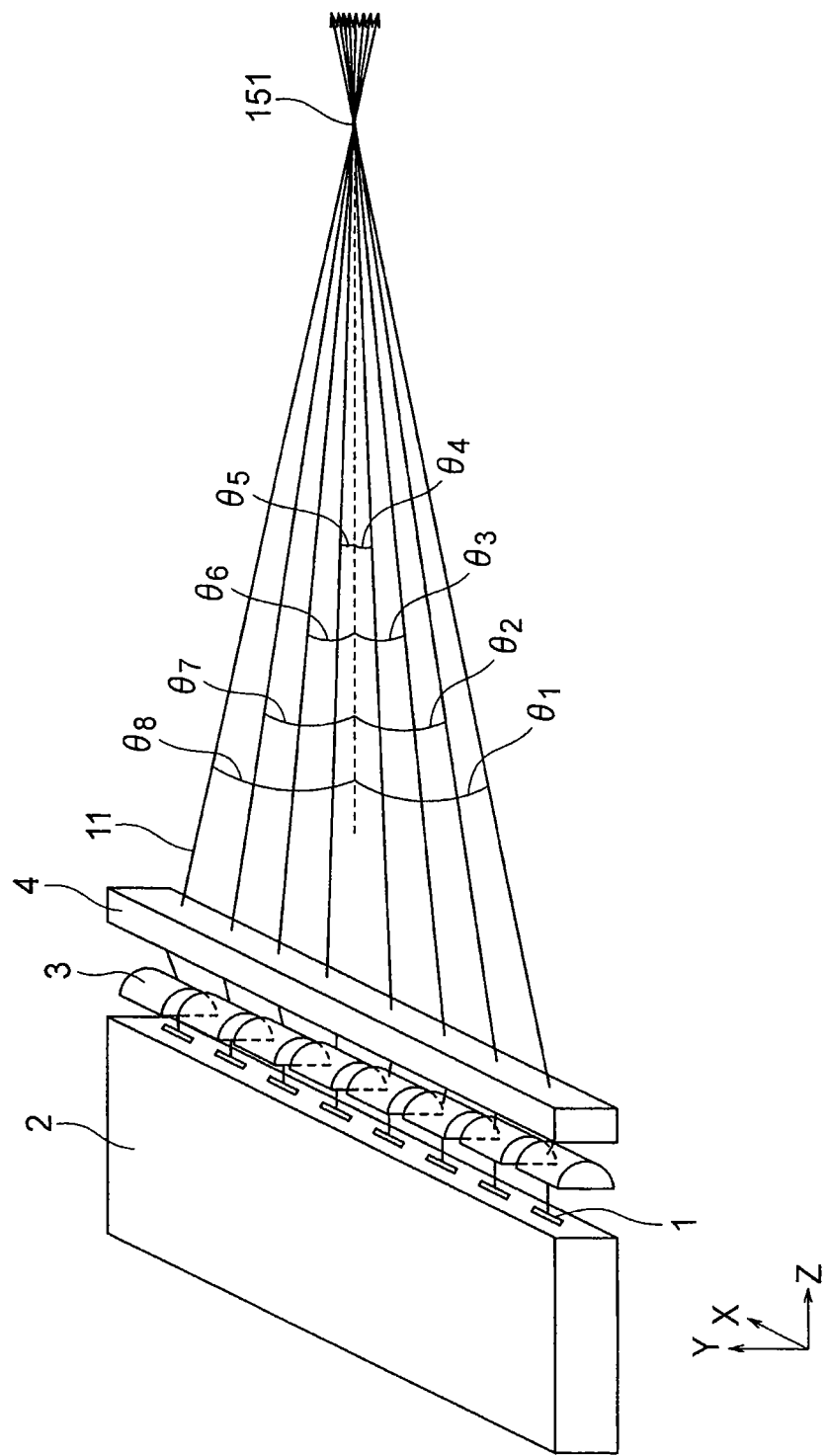

SEMICONDUCTOR LASER APPARATUS

TECHNICAL FIELD

The present invention relates to a semiconductor laser apparatus in which wavelengths of beams are overlapped on one another by a wavelength dispersion optical element having a wavelength dispersion function.

BACKGROUND ART

In a related-art semiconductor laser apparatus, the following technology for improving the brightness of a semiconductor laser is known. Divergence angles of beams emitted from light emitting points of a semiconductor laser bar are corrected, and the beams are rotated and then focused on a wavelength dispersion optical element with use of a lens. Wavelength dispersibility of the wavelength dispersion optical element is utilized to overlap the beams emitted from the light emitting points, and a partially transmissive mirror is arranged for the overlapped beams to form an external cavity (see, for example, Patent Literature 1).

CITATION LIST

Patent Literature

[PTL 1] US 2011/0216417 A1 (FIG. 3A)

SUMMARY OF INVENTION

Technical Problem

The related-art semiconductor laser apparatus needs a condenser lens for focusing the beams emitted from different light emitting points of the semiconductor laser bar. It is accordingly necessary to secure a distance between the semiconductor laser bar and the condenser lens and a distance between the condenser lens and the wavelength dispersion optical element. Each of the distances to be secured is determined based on a relationship between the size of the semiconductor laser bar and the wavelength dispersibility of the wavelength dispersion optical element, resulting in a problem in that the entire apparatus cannot be downsized and simplified.

The present invention has been made in order to solve the above-mentioned problem, and it is an object thereof to provide a high-brightness semiconductor laser apparatus with a compact and simple configuration.

Solution to Problem

According to one embodiment of the present invention, there is provided a semiconductor laser apparatus, including: a semiconductor laser bar having a plurality of light emitting points for emitting a plurality of beams; a beam divergence angle correction optical system for correcting a divergence angle of each of the plurality of beams emitted from the plurality of light emitting points; a beam rotation optical system for rotating the each of the plurality of beams having the divergence angle corrected by the beam divergence angle correction optical system with respect to an optical axis thereof; a wavelength dispersion optical element having a wavelength dispersion function, which is arranged at a focused position of the plurality of beams transmitted through the beam rotation optical system; and a partial reflection mirror arranged on an optical path of the plurality of beams that are reflected by the wavelength dispersion optical element and overlapped on the same axis, in which a relative position of the beam divergence angle correction optical system with respect to the each of the plurality of light emitting points in a divergence angle correction direction sequentially changes in order of arrangement of the plurality of light emitting points.

Advantageous Effects of Invention

According to the one embodiment of the present invention, by changing a positional relationship between each light emitting point of the semiconductor laser bar and the beam divergence angle correction optical system, the beams may be overlapped on the same axis without arranging an additional condenser lens. Consequently, a high-brightness semiconductor laser apparatus with a more compact and simpler configuration may be obtained.

BRIEF DESCRIPTION OF DRAWINGS

FIG. 9B is a perspective view illustrating the beam focusing effect according to the first embodiment of the present invention.

DESCRIPTION OF EMBODIMENTS

First Embodiment

Figure 1:
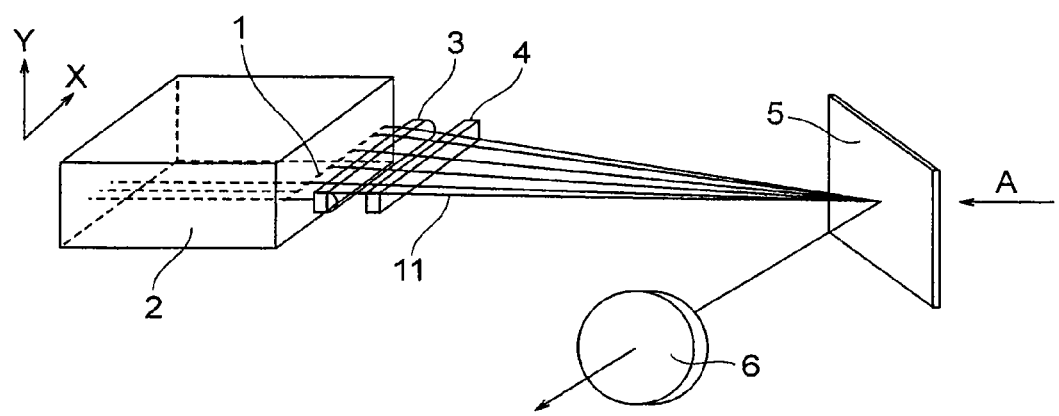
FIG. 1 is a perspective view schematically illustrating a semiconductor laser apparatus according to a first embodiment of the present invention.

FIG. 1 is a perspective view schematically illustrating a semiconductor laser apparatus according to a first embodiment of the present invention.

In FIG. 1, the semiconductor laser apparatus includes a semiconductor laser bar 2 having a plurality of light emitting points 1, beam divergence angle correction optical systems 3 arranged so as to be opposed to the light emitting points 1, a beam rotation optical system 4 arranged so as to be opposed to the beam divergence angle correction optical systems 3, a wavelength dispersion optical element 5 arranged at a focused position of a plurality of beams 11 transmitted through the beam divergence angle correction optical systems 3 and the beam rotation optical system 4, and a partial reflection mirror 6 arranged on an optical path of a beam reflected by the wavelength dispersion optical element 5.

Each of the beam divergence angle correction optical systems 3 is arranged on an optical axis of each of the plurality of beams 11 emitted from the semiconductor laser bar 2 having the plurality of light emitting points 1.

The beams 11 emitted from the plurality of light emitting points 1 are corrected for divergence angle by the beam divergence angle correction optical systems 3, and then enter the beam rotation optical system 4 to be rotated by about 90 degrees in a plane perpendicular to the optical axes of the beams.

The beams 11 emitted from the beam rotation optical system 4 are focused at substantially one point by a mechanism to be described later. The wavelength dispersion optical element 5 is arranged at the position at which the beams 11 are focused.

The wavelength dispersion optical element 5 has diffraction characteristics and refraction angles different depending on the wavelength. Selecting an appropriate wavelength dispersion value enables the plurality of beams 11 having different wavelengths and different incident angles to be overlapped on substantially the same axis.

The function of the wavelength dispersion optical element 5 is easily understood when considered as contrary to "dispersion". Specifically, "dispersion" is the phenomenon in which incident beams 11 having different wavelengths on the same axis are separated from one another in different directions depending on the wavelength, but according to the wavelength dispersion optical element 5 of FIG. 1, the plurality of beams 11 having different wavelengths, which have entered from different directions, may be overlapped to become a beam on substantially the same axis by the wavelength dispersion optical element 5.

Further, the partial reflection mirror 6 is arranged on the optical axis of the beams overlapped on substantially the same axis. An external cavity is formed by the components from a reflection surface of the partial reflection mirror 6 to an end surface (reflection surface) of the semiconductor laser bar 2, which is on the opposite side to another end surface of the semiconductor laser bar 2 from which the beams are emitted from the light emitting points 1.

With the external cavity configured in this manner, each of the light emitting points 1 of the semiconductor laser bar 2 passively oscillates a laser at a different wavelength.

The beams 11 oscillated at different wavelengths are transmitted through the wavelength dispersion optical element 5 so as to be overlapped on one another to become a single beam on substantially the same axis. Consequently, the brightness of the semiconductor laser may be enhanced.

Next, each component in FIG. 1 is described in more detail.

The dimensions on the Y-X plane of each of the plurality of light emitting points 1 of the semiconductor laser bar 2 are several μm×several tens of μm to several μm×several hundreds of μm.

In general, the Y-axis direction of several μm is referred to as "fast-axis direction" and the X-axis direction of several tens of μm to several hundreds of μm is referred to as "slow-axis direction".

The beam 11 emitted from the light emitting point 1 diverges quickly in the fast-axis direction (Y axis) and diverges gradually in the slow-axis direction (X axis).

In general, a beam product parameter indicating the quality of the beam 11 is set near the diffraction-limited value for the fast-axis direction (Y axis) and set to about ten times as large as the diffraction-limited value for the slow-axis direction (X axis).

On the semiconductor laser bar 2, the light emitting points 1 are arranged in line at equal pitches x, and the arrangement direction of the light emitting points 1 is parallel to the slow-axis direction (X axis).

The beam divergence angle correction optical system 3 is an optical system for correcting a divergence angle of the beam 11 in the fast-axis direction (Y axis) in which the beam diverges quickly, and is constructed by a cylindrical lens or a cylindrical mirror. When the beam is transmitted through the beam divergence angle correction optical system 3, the beam divergence angle in the fast-axis direction (Y axis) is substantially corrected.

Figure 2:
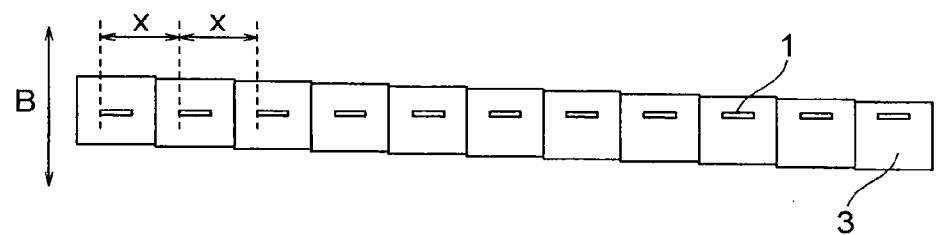
FIG. 2 is a plan view illustrating positional relationships between light emitting points of a semiconductor laser bar and beam divergence angle correction optical systems according to the first embodiment of the present invention.

As the beam rotation optical system 4, a cylindrical lens array disclosed in Publication (JP 2000-137139 A; FIG. 2) is used. The cylinder axis of each cylindrical lens included in the cylindrical lens array is inclined at about 45 degrees with respect to the fast-axis direction (Y axis) and the slow-axis direction (X axis) of the beam 11 in an incident plane or an exit plane of the beam 11. As the beam rotation optical system 4, a prism array disclosed in Patent Literature 1 (US 2007/0035861 A1), a reflector array disclosed in Publication (WO 98/08128 A1), or the like is used instead.

When the beam emitted from each light emitting point 1 is transmitted through the beam rotation optical system 4 having the above-mentioned array configuration, the beam 11 is rotated by about 90 degrees in a plane perpendicular to the optical axis thereof.

As the wavelength dispersion optical element 5, a reflective or transmissive diffraction grating or a prism may be used. Note that, the diffraction grating is larger than the prism in wavelength dispersibility (change in diffraction angle and refraction angle accompanying the change in wavelength), and hence the use of the diffraction grating may downsize the entire apparatus more greatly.

Next, referring to FIGS. 2 to 8, a mechanism of focusing the plurality of beams 11 emitted from different light emitting points 1 of the semiconductor laser bar 2 onto the wavelength dispersion optical element 5 is described.

FIG. 2 is a plan view illustrating positional relationships between the plurality of light emitting points 1 of the semiconductor laser bar 2 and the beam divergence angle correction optical systems 3, illustrating the positional relationships therebetween when viewed in the direction of arrow A in FIG. 1.

In FIG. 2, the direction of divergence angle correction by the beam divergence angle correction optical systems 3 is indicated by the arrow B. In this case, the light emitting points 1 are arranged in the X-axis direction at the pitches×(equal pitches), and the beam divergence angle correction optical systems 3 are arranged correspondingly to the individual light emitting points 1 so that the relative positions of the beam divergence angle correction optical systems 3 with respect to the light emitting points 1 are sequentially shifted in the divergence angle correction direction (direction of arrow B).

Figure 3:
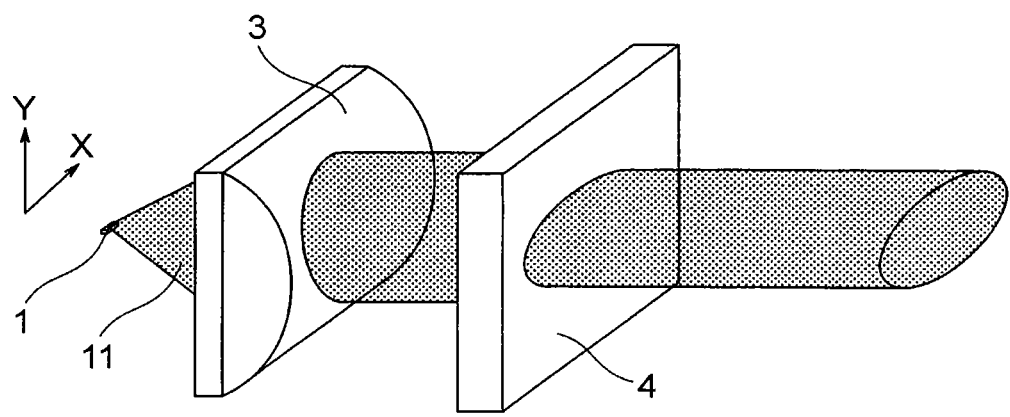
FIG. 3 is a perspective view illustrating a beam focusing effect according to the first embodiment of the present invention.
Figure 4:
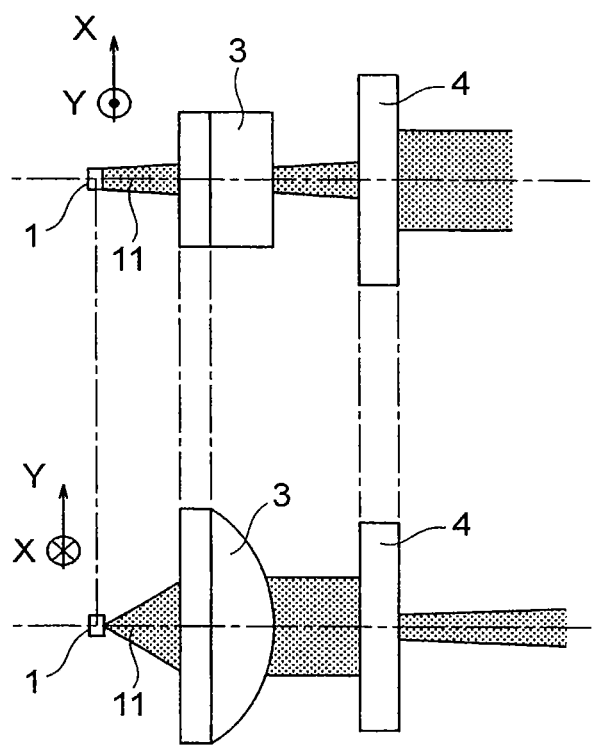
FIG. 4 is a plan view and a side view illustrating the beam focusing effect according to the first embodiment of the present invention.

FIG. 3 is a perspective view illustrating a beam focusing effect according to the first embodiment of the present invention, illustrating only a positional relationship between the light emitting point 1, the beam divergence angle correction optical system 3, and the beam rotation optical system 4, and the beam 11. Further, FIG. 4 is a plan view and a side view of the positional relationship of FIG. 3 when viewed in the Y-axis direction and the X-axis direction, respectively.

Figure 5:
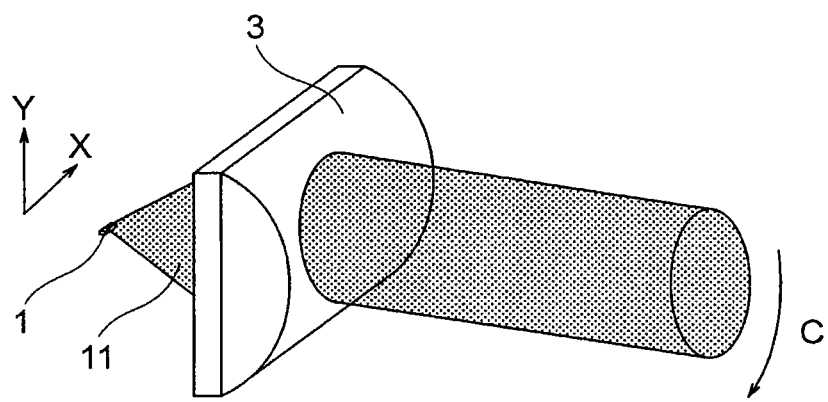
FIG. 5 is a perspective view illustrating a beam focusing effect according to the first embodiment of the present invention.
Figure 6:
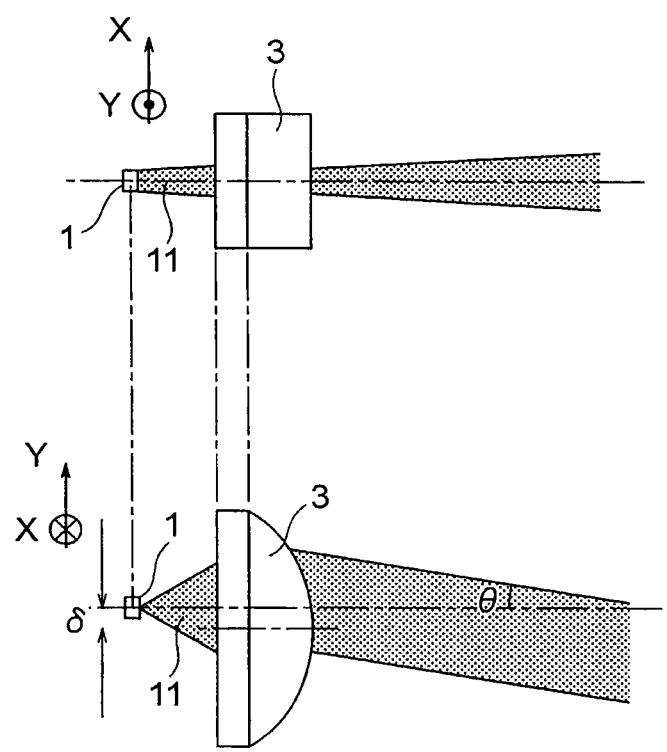
FIG. 6 is a plan view and a side view illustrating the beam focusing effect according to the first embodiment of the present invention.

FIG. 5 is a perspective view illustrating a beam focusing effect (beam divergence angle correction mechanism) according to the first embodiment of the present invention, illustrating a positional relationship between the light emitting point 1 and the beam divergence angle correction optical system 3, and the beam 11 at the time when the beam 11 is corrected by the beam divergence angle correction optical system 3 (arrow C). Further, FIG. 6 is a plan view and a side view of the positional relationship of FIG. 5 when viewed in the Y-axis direction and the X-axis direction, respectively.

Figure 7:
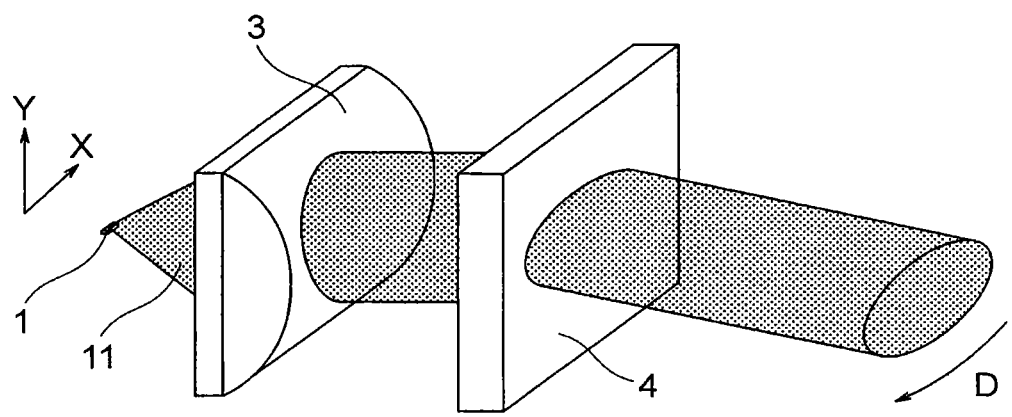
FIG. 7 is a perspective view illustrating a beam inclination generation mechanism according to the first embodiment of the present invention.
Figure 8:
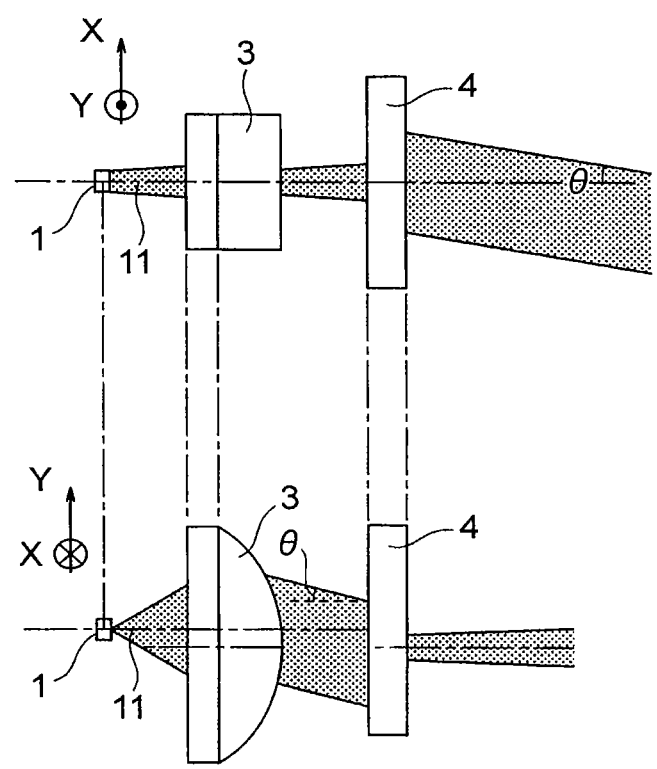
FIG. 8 is a plan view and a side view illustrating the beam inclination generation mechanism according to the first embodiment of the present invention.

Similarly, FIG. 7 is a perspective view illustrating a beam focusing effect (beam inclination generation mechanism) according to the first embodiment of the present invention, illustrating a positional relationship between the light emitting point 1, the beam divergence angle correction optical system 3, and the beam rotation optical system 4, and the beam 11 after the beam 11 is rotated by the beam rotation optical system 4 (arrow D). Further, FIG. 8 is a plan view and a side view of the positional relationship of FIG. 7 when viewed in the Y-axis direction and the X-axis direction, respectively.

Note that, for simple description, FIGS. 3 to 8 illustrate only a beam optical path (gray region) of only a single light emitting point 1.

First, referring to FIGS. 3 to 6, how the beam optical axis changes when the relative positional relationship between the light emitting point 1 and the beam divergence angle correction optical system 3 is changed is described.

A case is now considered in which the positional relationship between the light emitting point 1 and the beam divergence angle correction optical system 3 is on the same axis.

In the state illustrated in FIGS. 3 and 4 before the beam divergence angle is corrected, the beam 11 is emitted through the beam divergence angle correction optical system 3 and the beam rotation optical system 4 in the direction substantially perpendicular to the exit surface of the semiconductor laser bar 2.

On the other hand, as illustrated in FIGS. 5 and 6, when the relative positions of the light emitting point 1 and the beam divergence angle correction optical system 3 are changed in the beam divergence angle correction direction (arrow C), the optical axis of the beam 11 emitted from the beam divergence angle correction optical system 3 has an inclination θ in the beam divergence angle correction direction.

The inclination θ of the optical axis in this case is expressed by Expression (1) by using a relative positional change amount δ between the light emitting point 1 and the beam divergence angle correction optical system 3 and a focal distance F of the beam divergence angle correction optical system 3.

[Math. 1]
$$\theta = \arctan\left(\frac{\delta}{F}\right) \quad (1)$$

Note that, when the relative positional change amount δ is sufficiently smaller than the focal distance F of the beam divergence angle correction optical system 3, the inclination θ of the optical axis is expressed by Expression (2) obtained by approximating Expression (1).

[Math. 2]
$$\theta \cong \frac{\delta}{F} \quad (2)$$

In other words, in this case, the inclination θ of the optical axis is substantially proportional to the relative positional change amount δ between the light emitting point 1 and the beam divergence angle correction optical system 3.

Subsequently, when the beam 11 emitted from the beam divergence angle correction optical system 3 enters the beam rotation optical system 4, the beam is rotated by about 90 degrees (see the arrow D) as illustrated in FIGS. 7 and 8.

As a result, the optical axis of the beam 11 is also rotated by 90 degrees, and has the inclination θ (see FIG. 8) from the direction perpendicular to the exit surface of the semiconductor laser bar 2 in a plane perpendicular to the beam divergence angle correction direction.

Consequently, by sequentially adjusting the inclinations θ of the optical axes for the plurality of light emitting points 1 as illustrated in FIG. 2, the optical axes from different light emitting points 1 may be focused at one point.

In the above description with reference to FIGS. 3 to 8, attention is focused only on a single light emitting point 1 in order to simplify the description. In contrast, FIGS. 9A and 9B illustrate the case where a plurality of light emitting points 1 are used.

Figure 9A:
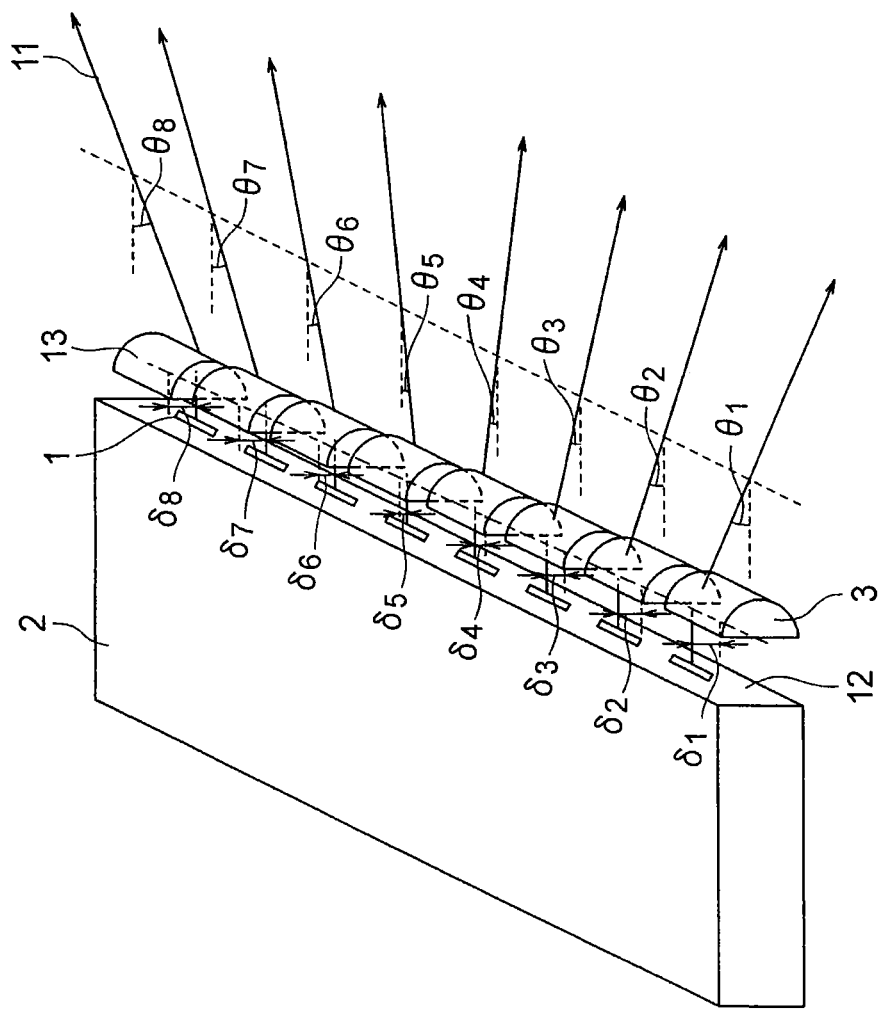
FIG. 9A is a perspective view illustrating the beam focusing effect according to the first embodiment of the present invention.

Now, referring to FIGS. 9A and 9B, the mechanism of focusing the plurality of beams 11 emitted from different light emitting points 1 of the semiconductor laser bar 2 onto the wavelength dispersion optical element 5 is described in more detail. FIGS. 9A and 9B are perspective views illustrating the mechanism of focusing the plurality of beams 11 emitted from different light emitting points 1 of the semiconductor laser bar 2 onto the wavelength dispersion optical element 5.

Note that, FIGS. 9A and 9B illustrate only the optical axes of the beams 11 in order to simplify the description. Further, in addition to the X axis that is the slow-axis direction and the Y axis that is the fast-axis direction described above, the Z axis perpendicular to the XY plane is also illustrated. Further, FIGS. 9A and 9B exemplify the case where eight light emitting points 1 are used, but the number of light emitting points 1 is not limited thereto and only needs to be at least two.

As illustrated in FIG. 9A, the beam divergence angle correction optical systems 3, which are arranged correspondingly to the light emitting points 1 so that the relative positions of the beam divergence angle correction optical systems 3 with respect to the light emitting points 1 are sequentially shifted in the divergence angle correction direction (Y direction), are mounted to the semiconductor laser bar 2 having the plurality of light emitting points 1.

In this case, an end surface 12 of the semiconductor laser bar 2 is positioned to be substantially parallel to an end surface 13 of the beam divergence angle correction optical system 3. Further, the beam divergence angle correction optical system 3 is arranged at a position at which the divergence angle of the beam 11 in the fast-axis direction (Y direction) is corrected.

The optical axis of each beam 11 emitted from each light emitting point 1 of the semiconductor laser bar 2 enters a corresponding beam divergence angle correction optical system 3. In this case, however, the components of the beam divergence angle correction optical systems 3 are arranged so that the relative positions of the beam divergence angle correction optical systems 3 with respect to the light emitting points 1 are sequentially shifted in the divergence angle correction direction (Y direction). Accordingly, the optical axes of the respective light emitting points 1 enter the beam divergence angle correction optical systems 3 with relative positional change amounts $\delta_1$ to $\delta_8$ with respect to the beam divergence angle correction optical systems 3.

Further, the optical axes of the respective light emitting points 1, which have entered the beam divergence angle correction optical systems 3 with the relative positional change amounts $\delta_1$ to $\delta_8$, pass through the beam divergence angle correction optical systems 3 to be bent in the Y direction, and the beams travel with angles $\theta_1$ to $\theta_8$ corresponding to the relative positional change amounts $\delta_1$ to $\delta_8$.

After that, as illustrated in FIG. 9B, the beam rotation optical system 4 is mounted behind the beam divergence angle correction optical systems 3, and the optical axes of the light emitting points 1 are rotated by 90 degrees. Then, the beams travel with angles in the directions illustrated in FIG. 9B. Travel angles $\theta_1$ to $\theta_8$ (FIG. 9B) in this case have substantially the same values as the travel angles $\theta_1$ to $\theta_8$ (FIG. 9A) before the beam rotation optical system 4 is mounted.

The optical axes of the beams 11 traveling with the angles $\theta_1$ to $\theta_8$ illustrated in FIG. 9B intersect substantially at one point, to thereby form a beam overlapped point 151.

Subsequently, what functions represent the relative positional change amount $\delta$ between the light emitting point 1 and the beam divergence angle correction optical system 3 is described below.

Taking an example where the optical axes of the beams 11 emitted from two light emitting points 1 that are separated from each other by the pitch x on the semiconductor laser bar 2 intersect at a position on the optical path separated from the semiconductor laser bar 2 by a distance L, the pitch x of the light emitting points 1 is expressed by Expression (3) by using the inclinations $\theta_1$ and $\theta_2$ of the optical axes extending from the two light emitting points 1.

[Math. 3]

$$x = L|\tan\theta_1 - \tan\theta_2| \tag{3}$$

Note that, if $\theta \ll 1$ is established (if $\theta$ is sufficiently smaller than 1), the pitch x is expressed by Expression (4) obtained by approximating Expression (3).

[Math. 4]

$$x \approx L|\theta_1 - \theta_2| \tag{4}$$

Accordingly, by substituting Expression (2) into Expression (4), the pitch x is expressed by Expression (5).

[Math. 5]

$$x = \frac{L}{F}|\delta_1 - \delta_2| \tag{5}$$

Note that, in general, the pitch x between adjacent light emitting points 1 on the semiconductor laser bar 2 has a fixed value, and hence as apparent from Expression (5), a difference of relative positional change amounts $\delta$ for adjacent light emitting points 1 ($|\delta_1-\delta_2|$ to be described later) has a fixed value.

In other words, the relative positional change amount $\delta$ between the light emitting point 1 of the semiconductor laser bar 2 and the beam divergence angle correction optical system 3 is expressed by a linear function with respect to the pitch x of the light emitting points 1 in the arrangement direction (X-axis direction).

For example, the pitch x of the light emitting points 1, the focal distance F of the beam divergence angle correction optical system 3, and the distance L to the focus point are set to x=500 μm, F=0.8 mm, and L=200 mm, respectively. Then, the difference $|\delta_1-\delta_2|$ of the relative positional change amounts ($\delta_1, \delta_2$) between adjacent light emitting points 1 of the semiconductor laser bar 2 and the beam divergence angle correction optical systems 3 is determined by Expression (6).

[Math. 6]

$$|\delta_1 - \delta_2| = \frac{xF}{L} \tag{6}$$

Note that, if the pitch x, the focal distance F, and the distance L are fixed at the above-mentioned values, the positional shift difference $|\delta_1-\delta_2|$ between each of adjacent light emitting points 1 and the beam divergence angle correction optical system 3 is constant at 2 μm (=0.5 mm×0.8 mm/200 mm=0.002 mm).

Figure 10:
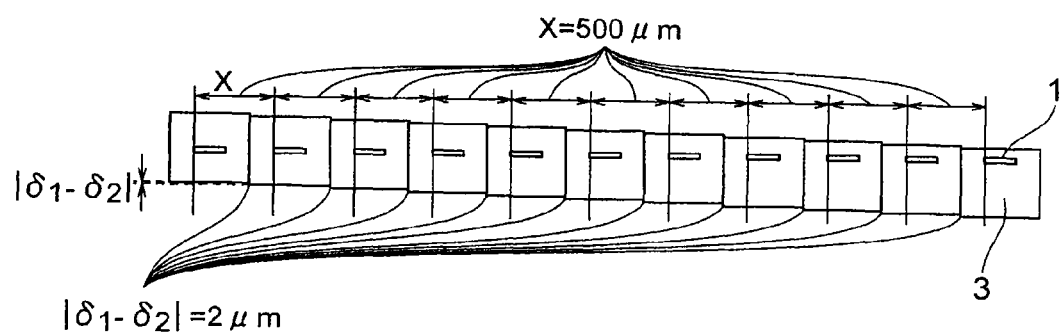
FIG. 10 is a plan view illustrating a positional relationship between the light emitting points of the semiconductor laser bar and the beam divergence angle correction optical system according to the first embodiment of the present invention.

FIG. 10 is a plan view illustrating the positional relationship among the light emitting points 1 of the semiconductor laser bar 2 and the beam divergence angle correction optical systems 3 that have the above-mentioned values, and corresponds to FIG. 2 referred to above.

As described above, the semiconductor laser apparatus according to the first embodiment (FIGS. 1 to 10) of the present invention includes the semiconductor laser bar 2 having the plurality of light emitting points 1 for emitting the plurality of beams 11, the beam divergence angle correction optical system 3 for correcting the divergence angle of each of the plurality of beams 11 emitted from the plurality of light emitting points 1, the beam rotation optical system 4 for rotating the each of the plurality of beams 11 having the divergence angle corrected by the beam divergence angle correction optical system 3 with respect to the optical axis thereof, the wavelength dispersion optical element 5 having the wavelength dispersion function, which is arranged at the focused position of the plurality of beams 11 transmitted through the beam rotation optical system 4, and the partial reflection mirror 6 arranged on the optical path of the plurality of beams that are reflected by the wavelength dispersion optical element 5 and overlapped on the same axis. The relative positions of the beam divergence angle correction optical systems 3 with respect to the plurality of light emitting points 1 in the divergence angle correction direction (direction of arrow B in FIG. 2) sequentially change in the order of arrangement of the plurality of light emitting points 1.

Further, the plurality of light emitting points 1 are arranged on the semiconductor laser bar 2 at equal pitches, and the difference ($=|\delta_1-\delta_2|$) of the relative positional change amounts $\delta_1$ and $\delta_2$ of the beam divergence angle correction optical systems 3 with respect to adjacent two light emitting points 1 in the divergence angle correction direction is set to a fixed value for each pair of the adjacent two light emitting points 1. In other words, the relative positions of the beam divergence angle correction optical systems 3 with respect to the plurality of light emitting points 1 in the divergence angle correction direction sequentially change by the fixed value $|\delta_1-\delta_2|$ in the order of arrangement of the light emitting points 1 (see FIG. 5).

Consequently, the beams 11 emitted from different light emitting points 1 of the semiconductor laser bar 2 pass through the beam divergence angle correction optical systems 3 and the beam rotation optical system 4 to be focused onto the wavelength dispersion optical element 5. In other words, the beam divergence angle correction optical system 3 substantially functions as a condenser lens in cooperation with the beam rotation optical system 4.

As a result, there is no need to arrange a condenser lens on the downstream side of the beam rotation optical system 4, and the wavelength dispersion optical element 5 may overlap the beams 11 so as to be a laser beam on the same axis, thereby being capable of downsizing the entire apparatus and simplifying the configuration.

Consequently, a high-brightness semiconductor laser apparatus with a compact and simple configuration may be obtained without arranging any condenser lens.

Second Embodiment

Figure 11:
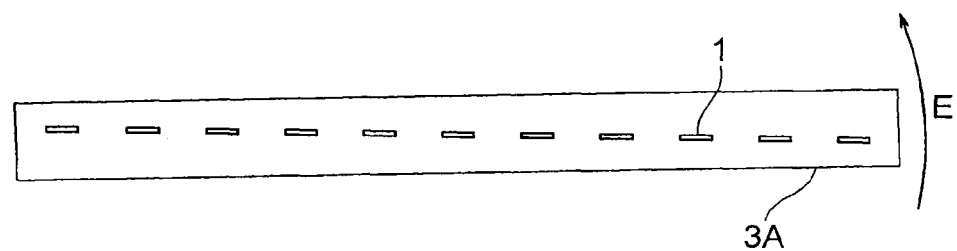
FIG. 11 is a plan view illustrating a positional relationship between light emitting points of a semiconductor laser bar and a beam divergence angle correction optical system according to a second embodiment of the present invention.

Note that, in the above-mentioned first embodiment (FIGS. 2 and 10), the planar shape of the beam divergence angle correction optical system 3 is illustrated as a plurality of pieces, but as illustrated in FIG. 11, for example, a beam divergence angle correction optical system 3A formed of an integrally-shaped cylindrical lens may be rotated slightly in the direction of arrow E so that the relative positions of the beam divergence angle correction optical system 3A with respect to the light emitting points 1 may be sequentially changed.

FIG. 11 is a plan view illustrating a positional relationship between the light emitting points 1 and the beam divergence angle correction optical system 3A in a semiconductor laser apparatus according to the second embodiment of the present invention.

In this case, only the planar shape of the beam divergence angle correction optical system 3A is different from the above-mentioned planar shape. The other configurations (not shown) are the same as described above (FIG. 1).

For example, the above-mentioned beam divergence angle correction optical system 3 including a plurality of pieces (FIGS. 2 and 10) is illustrated in order to clearly illustrate the relative positional shift difference $|\delta_1-\delta_2|$ between adjacent two light emitting points 1, and it is practically difficult to manufacture the optical system configuration of FIGS. 2 and 10 while regulating each relative positional shift with high accuracy.

For this reason, it is desired that the beam divergence angle correction optical system 3A using an ordinary cylindrical lens be inclined by a minute angle as illustrated in FIG. 11.

In FIG. 11, the beam divergence angle correction optical system 3A formed into the cylindrical lens shape is arranged so as to be slightly rotated (inclined) in the direction of arrow E with respect to the light emitting points 1 of the semiconductor laser bar 2 (see FIG. 1) in a plane parallel to the exit end surface of the semiconductor laser bar 2.

Note that, in this case, the relative positions of the beam divergence angle correction optical system 3A with respect to the light emitting points 1 are shifted in the direction opposite to that described above (FIGS. 2 and 10), but, for example, when the rotation direction of the beams by the downstream beam rotation optical system 4 is set opposite to that described above (direction of arrow D in FIG. 7), the beams 11 may be focused on the wavelength dispersion optical element 5 similarly to the above.

As described above, the beam divergence angle correction optical system 3A according to the second embodiment (FIG. 11) of the present invention is formed of a cylindrical lens, and is arranged obliquely relative to each of the plurality of light emitting points 1 in a plane perpendicular to the optical axis of each of the beams 11 emitted from the plurality of light emitting points 1.

With this, the action of focusing the beams 11 may be realized in the same manner as in the above-mentioned first embodiment by using the beam divergence angle correction optical system 3A, which has a single and inexpensive cylindrical lens shape used commonly. Consequently, the cost may be reduced in addition to the above-mentioned effect.

Further, through the adjustment of the rotation angle of the beam divergence angle correction optical system 3A with respect to the semiconductor laser bar 2, the distance L between the position at which the beams 11 are focused at one point and the semiconductor laser bar 2 may be easily adjusted.

Third Embodiment

Figure 12:
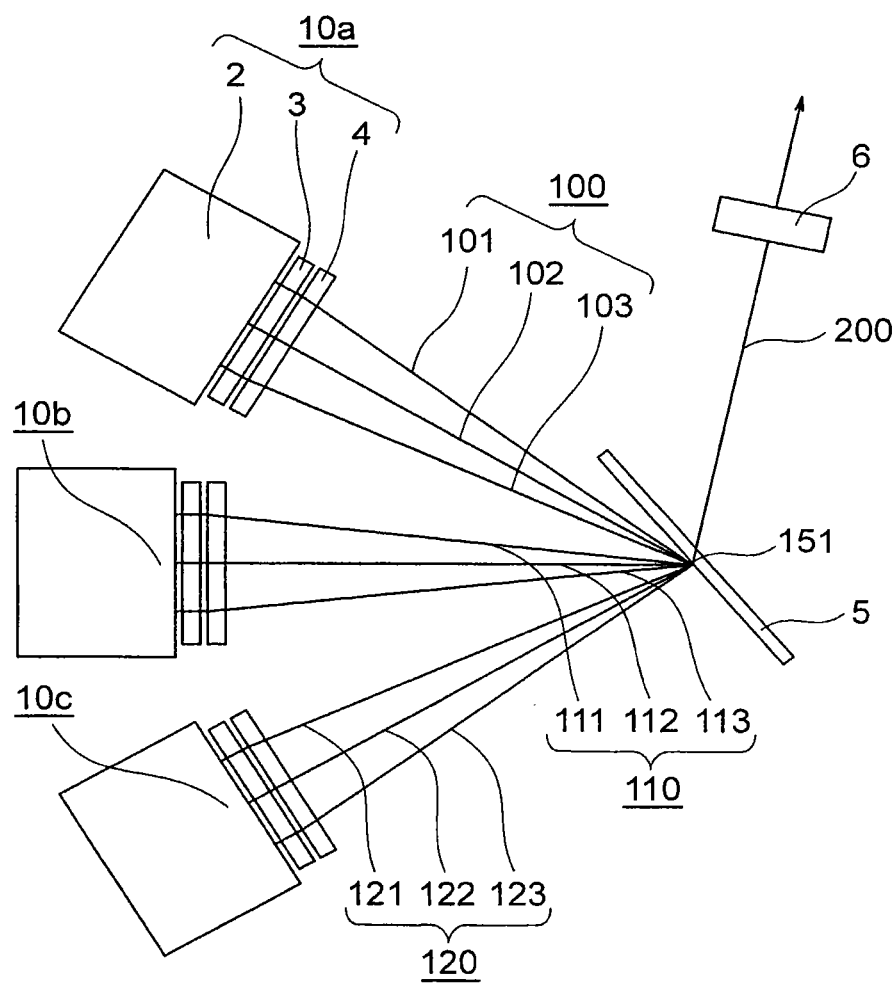
FIG. 12 is a plan view schematically illustrating a semiconductor laser apparatus according to a third embodiment of the present invention.
Figure 12:
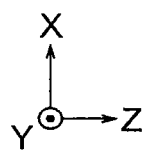

FIG. 12 is a plan view schematically illustrating a semiconductor laser apparatus according to a third embodiment of the present invention. Note that, in FIG. 12, attention needs to be paid to the fact that the straight lines representing beams 100, 110, and 120 to be described later indicate optical axes of the beams 100, 110, and 120.

In FIG. 12, the semiconductor laser apparatus includes three semiconductor lasers 10 (semiconductor lasers 10a to 10c), each of which includes the semiconductor laser bar 2, the beam divergence angle correction optical systems 3, and the beam rotation optical system 4 that are described in the above-mentioned first and second embodiments as one component, the wavelength dispersion optical element 5, and the partial reflection mirror 6.

Further, the beam 100 emitted from the semiconductor laser 10a is formed of three beams 101 to 103. Similarly, the beam 110 emitted from the semiconductor laser 10b is formed of three beams 111 to 113, and the beam 120 emitted from the semiconductor laser 10c is formed of three beams 121 to 123.

Note that, the case where three semiconductor lasers 10 are used is exemplified in the third embodiment, but the number of semiconductor lasers 10 is not limited thereto and only needs to be at least two. Further, the beams 100, 110, and 120 emitted from the respective semiconductor lasers 10a to 10c are each formed of three beams, but the number of beams is not limited thereto and only needs to be at least two. In addition, the brightness may be enhanced as the number of beams becomes larger, as long as the sufficient wavelength resolution of the wavelength dispersion optical element 5 is secured.

The beams 101 to 103 emitted from the semiconductor laser 10*a* are focused at substantially one point as described in the above-mentioned first embodiment. The same holds true for the semiconductor lasers 10*b* and 10*c*.

Further, the positions of the semiconductor lasers 10*a* to 10*c* are adjusted so that the point at which the beams 101 to 103 emitted from the semiconductor laser 10*a* are focused, the point at which the beams 111 to 113 emitted from the semiconductor laser 10*b* are focused, and the point at which the beams 121 to 123 emitted from the semiconductor laser 10*c* are focused may be substantially matched with one another. In this manner, the positions of the semiconductor lasers 10*a* to 10*c* are adjusted so that the nine beams in total are focused at substantially one point to form the beam overlapped point 151.

Further, the wavelength dispersion optical element 5 is arranged at the position of the beam overlapped point 151, and the partial reflection mirror 6 is arranged at an appropriate position as described in the above-mentioned first embodiment. With this configuration, the beams 101 to 103, 111 to 113, and 121 to 123 emitted from the respective semiconductor lasers 10*a* to 10*c* all oscillate passively at different wavelengths, and become a single beam 200 on substantially the same axis to be emitted from the partial reflection mirror 6.

As described above, the laser apparatus according to the third embodiment (FIG. 12) of the present invention includes the plurality of semiconductor lasers 10, and hence as compared to when the laser apparatus includes only one semiconductor laser 10, the power of the laser may be enhanced while the brightness of the laser is maintained. Further, it is hitherto necessary that a condenser lens for overlapping beams be arranged for each of the plurality of semiconductor lasers 10, with the result that the entire apparatus is upsized and the cost is high. In contrast, no condenser lens is necessary in the laser apparatus according to the third embodiment of the present invention, and hence the entire apparatus may be downsized and the cost may be reduced.

Fourth Embodiment

Figure 13:
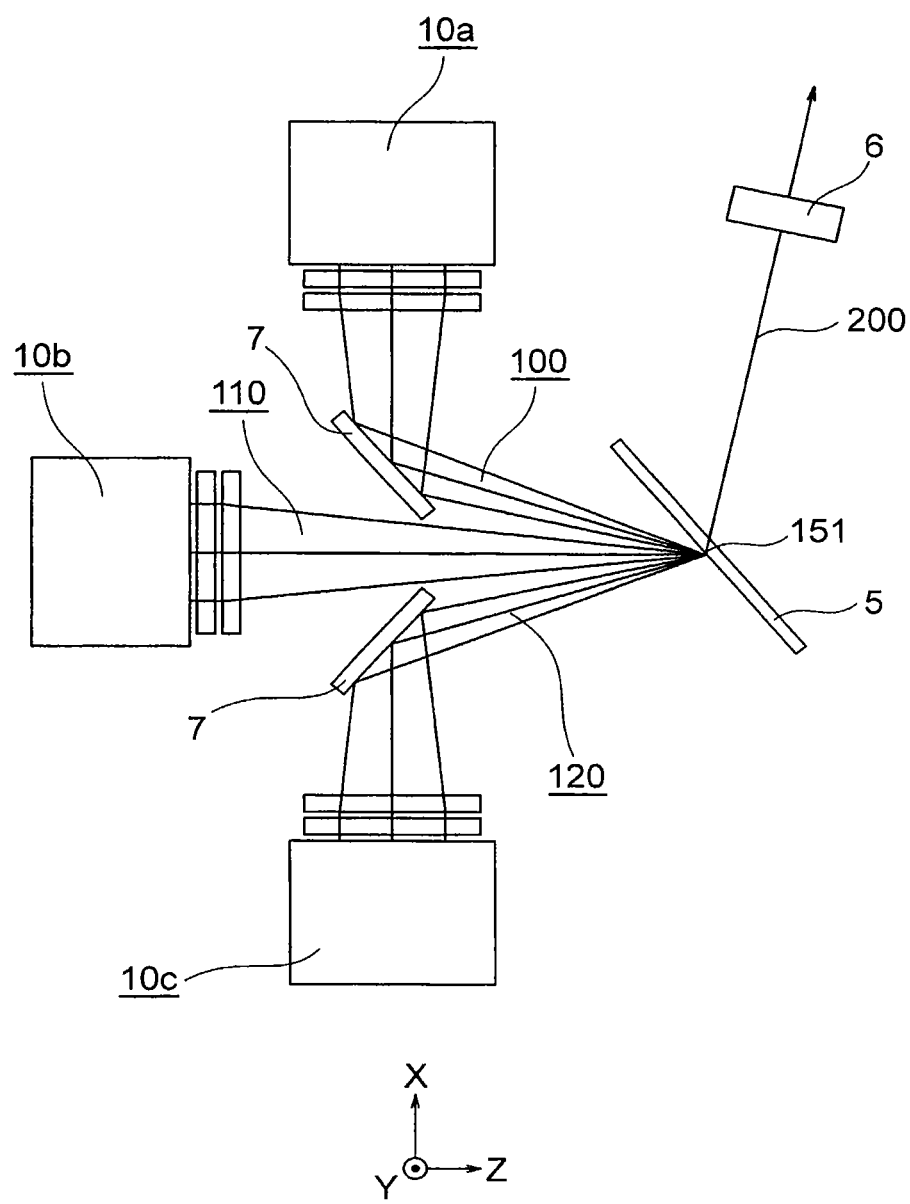
FIG. 13 is a plan view schematically illustrating a semiconductor laser apparatus according to a fourth embodiment of the present invention.

FIG. 13 is a plan view schematically illustrating a semiconductor laser apparatus according to a fourth embodiment of the present invention.

In FIG. 13, the semiconductor laser apparatus includes three semiconductor lasers 10 (semiconductor lasers 10*a* to 10*c*), the wavelength dispersion optical element 5, and the partial reflection mirror 6 that are described in the above-mentioned third embodiment, and further, two reflection optical elements 7. Note that, in the fourth embodiment, the three semiconductor lasers 10 are used similarly to the above-mentioned third embodiment, but the number of semiconductor lasers 10 is not limited thereto and only needs to be at least two.

Further, the case where the two reflection optical elements 7 for respectively reflecting the beams 100 and 120 emitted from the semiconductor lasers 10*a* and 10*c* to the direction toward the wavelength dispersion optical element 5 are used is exemplified in the fourth embodiment, but the configuration is not limited thereto. In other words, the technical feature in the fourth embodiment resides in that the reflection optical elements 7 are used so that the beams emitted from the plurality of semiconductor lasers 10 may be focused at one point to form the beam overlapped point 151, and hence the number and positions of the reflection optical elements 7 may be adjusted as appropriate.

Incidentally, when the semiconductor laser bar 2 in the semiconductor laser 10 is configured to operate with high power, the semiconductor laser bar 2 is generally arranged on a heat sink as countermeasures against thermal load. Further, it is common that such heat sink is twice as large as the semiconductor laser bar 2 or more. For this reason, if an attempt is made to arrange the semiconductor lasers 10 close to one another, the arrangement is limited by the size of the heat sink, and the beams 100, 110, and 120 emitted from the semiconductor lasers 10 cannot be made as close to one another as possible.

Accordingly, if an attempt is made to focus the beams 100, 110, and 120 emitted from the respective semiconductor lasers 10 at one point without any additional configuration, the angle of the beam entering the wavelength dispersion optical element 5 increases. Further, when the angle of the beam entering the wavelength dispersion optical element 5 increases, all the beams 100, 110, and 120 cannot be oscillated by the external cavity unless the oscillation wavelength width is increased or the distance from each semiconductor laser 10 to the wavelength dispersion optical element 5 is increased. Note that, the oscillation wavelength width as used herein is defined by a difference between a longest wavelength and a shortest wavelength among the oscillation wavelengths of the beams 100, 110, and 120 that oscillate at different wavelengths.

However, each semiconductor laser 10 oscillates the beams in the limited oscillation wavelength width, and hence in practice, there is no choice but to increase the distance from each semiconductor laser 10 to the wavelength dispersion optical element 5 in order to oscillate the beams 100, 110, and 120 at different wavelengths.

In contrast, in the fourth embodiment, the reflection optical element 7 for reflecting the beam emitted from each semiconductor laser 10 to the direction toward the wavelength dispersion optical element 5 is used so that the beams 100, 110, and 120 may be focused at one point to form the beam overlapped point 151. In this manner, as compared to when the reflection optical element 7 is not used, the beams 100, 110, and 120 emitted from the respective semiconductor lasers 10 may be made as close to one another as possible.

As described above, the laser apparatus according to the fourth embodiment (FIG. 13) of the present invention further includes the reflection optical elements 7 as compared to the laser apparatus according to the above-mentioned third embodiment (FIG. 12), and hence the beams emitted from the plurality of semiconductor lasers 10 may be made as close to one another as possible without being limited by the size of a heat sink or the like, and further may be focused at one point to form the beam overlapped point 151. Consequently, the angle of the beam entering the wavelength dispersion optical element 5 may be reduced, and the distance from each semiconductor laser 10 to the wavelength dispersion optical element 5 may be reduced, thereby being capable of downsizing the entire apparatus.

Fifth Embodiment

Figure 14:
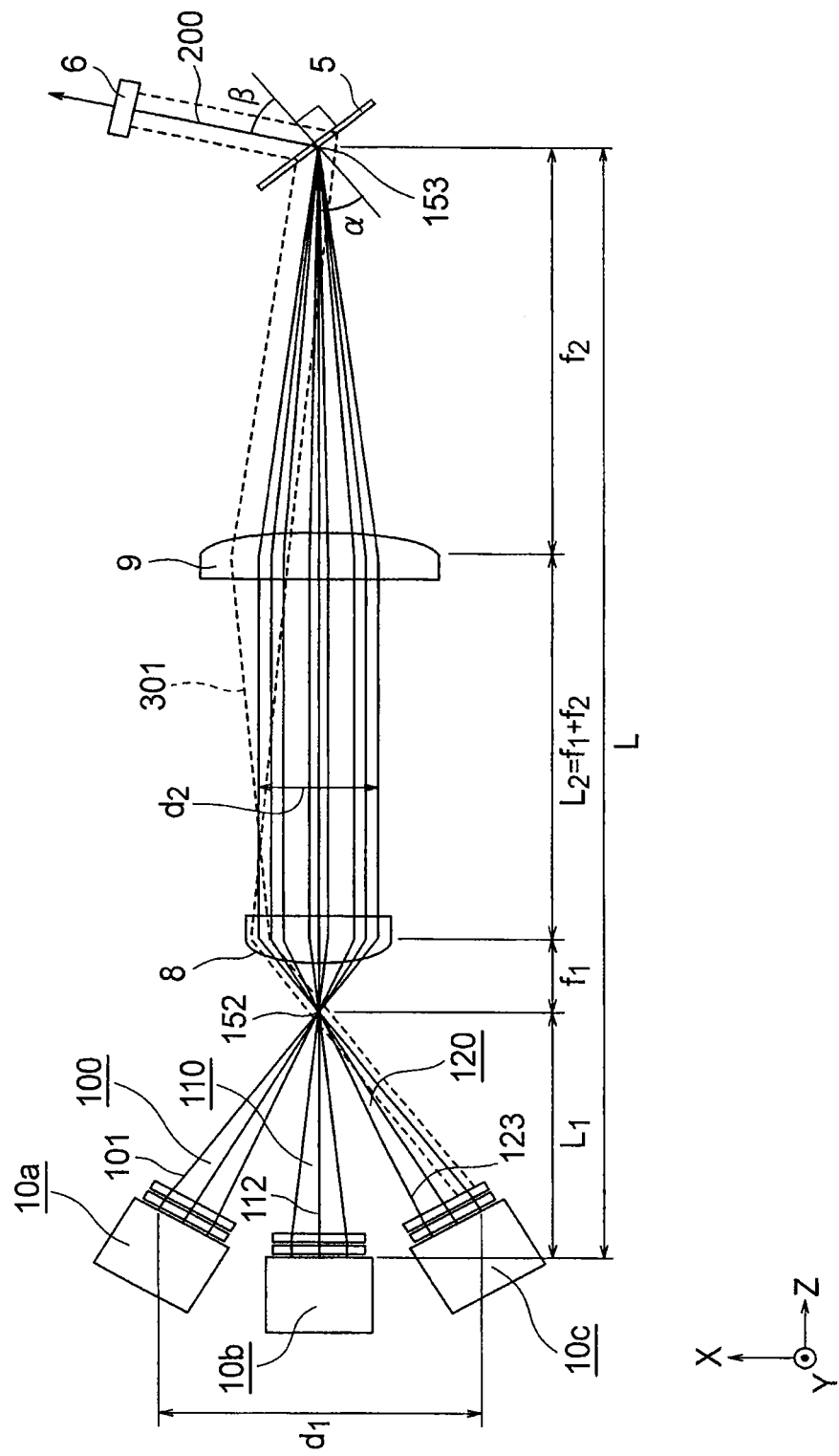
FIG. 14 is a plan view schematically illustrating a semiconductor laser apparatus according to a fifth embodiment of the present invention.

FIG. 14 is a plan view schematically illustrating a semiconductor laser apparatus according to a fifth embodiment of the present invention.

In FIG. 14, the semiconductor laser apparatus includes three semiconductor lasers 10 (semiconductor lasers 10*a* to 10*c*), the wavelength dispersion optical element 5, and the partial reflection mirror 6 that are described in the above-mentioned third embodiment, and further, a first lens 8 (focal distance $f_1$) and a second lens 9 (focal distance $f_2$). Note that, the case where three semiconductor lasers 10 are used is exemplified in the fifth embodiment similarly to the above-mentioned third embodiment, but the number of semiconductor lasers 10 is not limited thereto and only needs to be at least two. Further, the reflection optical element 7 may be used similarly to the above-mentioned fourth embodiment.

The first lens 8 is arranged at a position separated from a first beam overlapped point 152 at which the beams 100, 110, and 120 emitted from the respective semiconductor lasers 10 are overlapped on one another (focused at one point to form the first beam overlapped point 152) by the focal distance $f_1$. Further, the second lens 9 is arranged at a position separated from the first lens 8 by an arbitrary distance. In addition, a second beam overlapped point 153 is formed at a position separated from the second lens 9 by the focal distance $f_2$, and the wavelength dispersion optical element 5 is arranged at this position. Note that, in the following, the positional relationship among each semiconductor laser 10, the first lens 8, the second lens 9, and the wavelength dispersion optical element 5 is described with the semiconductor laser 10b used as a reference position.

Note that, the first lens 8 is not necessarily required to be arranged at the position separated from the first beam overlapped point 152 by the focal distance $f_1$ of the first lens 8, and the position of the first lens 8 may be adjusted as appropriate. Similarly, the wavelength dispersion optical element 5 is not necessarily required to be arranged at the position separated from the second lens 9 by the focal distance $f_2$ of the second lens 9, and the position of the wavelength dispersion optical element 5 may be adjusted as appropriate.

The optical axes of the beams 100, 110, and 120 emitted from the respective semiconductor lasers 10 are converted to be parallel to one another by the first lens 8, which is arranged at a position separated by the focal distance $f_1$ from the first beam overlapped point 152 arranged at a position separated by the distance $L_1$ from the semiconductor laser 10b.

Note that, in such a case, attention needs to be paid to the fact that the beams are not parallel in a beam width 301 (beam width corresponding to the section surrounded by the broken line in FIG. 14). Further, in FIG. 14, only the beam width 301 corresponding to the beam 123 emitted from the semiconductor laser 10c is exemplified, but the same holds true for beam widths corresponding to the other beams.

In this case, when the distance between the semiconductor laser 10a and the semiconductor laser 10c in the X direction is represented by "distance $d_1$", a distance $d_2$ between the beam 101 and the beam 123 in the X direction after the optical axes thereof are converted to be parallel to each other is expressed by Expression (7). Note that, in Expression (7), $d_2 < d_1$ is established when $L_1 > f_1$ is established.

[Math. 7]

$$d_2 = d_1 \times \frac{f_1}{L_1} \quad (7)$$

Further, as described above, the second lens 9 is arranged at the position separated from the first lens 8 by an arbitrary distance $L_2$, and hence the beams 100, 110, and 120 are overlapped on one another on the wavelength dispersion optical element 5.

Note that, the case where $L_2=f_1+f_2$ is established is exemplified in FIG. 14 for the sake of convenience, but the length of the distance $L_2$ is not limited thereto and may be any length. However, if $L_2 \ne f_1+f_2$ is established, additional measures need to be taken, such as arranging a third lens between the wavelength dispersion optical element 5 and the partial reflection mirror 6 or forming the partial reflection mirror 6 as a concave mirror (with its mirror surface formed into a concave shape).

Next, consideration is given of how long the distance L from the semiconductor laser 10b to the wavelength dispersion optical element 5 is necessary when the configuration of the semiconductor laser apparatus according to the fifth embodiment is not applied and the semiconductor lasers 10 are overlapped on one wavelength dispersion optical element 5 so that all the beams emitted from the semiconductor lasers 10 are oscillated at different wavelengths.

In such a case, a relational expression (grating equation) of Expression (8) is established among an incident angle α corresponding to an angle formed by the beam 112 emitted from the semiconductor laser 10b and a diffraction grating normal of the wavelength dispersion optical element 5, a diffraction angle β corresponding to an angle formed by the beam 200 emitted from the wavelength dispersion optical element 5 and the diffraction grating normal, the number N of grooves in the wavelength dispersion optical element 5, the diffraction order m, and a wavelength λ of the beam 112. Note that, the calculation using Expression (8) described below assumes that the diffraction order m is 1.

[Math. 8]

$$\sin \alpha + \sin \beta = Nm\lambda \quad (8)$$

Further, a relational expression of Expression (9) is established among the distance $d_1$ between the semiconductor laser 10a and the semiconductor laser 10c in the X direction, the oscillation wavelength width Δλ, the distance L from the semiconductor laser 10b to the wavelength dispersion optical element 5, the number N of grooves in the wavelength dispersion optical element 5, and the diffraction angle β.

[Math. 9]

$$\frac{d_1}{\Delta \lambda} = \frac{LN}{\cos \beta} \quad (9)$$

Now, the procedure of deriving Expression (9) is specifically described. First, both sides of Expression (8) are differentiated with respect to the wavelength λ to be expressed as Expression (10). Note that, in this case, the differentiation is performed on the assumption that the diffraction order m is 1 as described above and the incident angle α is constant.

[Math. 10]

$$\frac{d\beta}{d\lambda} \times \cos \beta = N$$

$$\frac{d\beta}{d\lambda} = \frac{N}{\cos \beta} \quad (10)$$

Subsequently, both sides of Expression (10) are multiplied by the distance L from the semiconductor laser 10b to the wavelength dispersion optical element 5 to be expressed as Expression (11).

[Math. 11]

$$L \times \frac{d\beta}{d\lambda} = L \times \frac{N}{\cos \beta} \quad (11)$$

Further, when the diffraction angle β is a small angle (dβ), a relational expression of Expression (12) is established between the distance L and the distance $d_1$.

[Math. 12]

$$L \times d\beta = d_1 \quad (12)$$

In addition, by substituting Expression (12) into Expression (11) and replacing dλ in Expression (11) with Δλ, the relational expression of Expression (9) is derived.

As a specific example, in the case of determining the distance L from the semiconductor laser 10b to the wavelength dispersion optical element 5, for example, it is assumed that the distance $d_1$ is 100 mm, the oscillation wavelength width Δλ is 40 nm, the number N of grooves in the wavelength dispersion optical element 5 is 1,500/mm, the incident angle α is 43°, and the wavelength λ of the beam 112 is 915 nm.

When those numerical values are substituted into Expressions (8) and (9), the distance L from the semiconductor laser 10b to the wavelength dispersion optical element 5 is determined as about 1,200 mm. In other words, in the case where the configuration of the semiconductor laser apparatus according to the fifth embodiment is not applied, the distance L from the semiconductor laser 10 to the wavelength dispersion optical element 5 needs to be about 1,200 mm. Note that, the reason why the incident angle α is assumed to be 43° is because diffraction efficiency of the wavelength dispersion optical element 5 is generally enhanced when the incident angle and the diffraction angle are substantially equal in value to each other.

In contrast, consideration is given of how long the distance L from the semiconductor laser 10b to the wavelength dispersion optical element 5 is necessary when the configuration of the semiconductor laser apparatus according to the fifth embodiment is applied and the semiconductor lasers 10 are overlapped on one wavelength dispersion optical element 5 so that all the beams emitted from the semiconductor lasers 10 are oscillated at different wavelengths.

Note that, the distance L in this case corresponds to the sum of the distance $L_1$ from the semiconductor laser 10b to the first beam overlapped point 152, the focal distance $f_1$ from the first beam overlapped point 152 to the first lens 8, the distance $L_2$ from the first lens 8 to the second lens 9, and the focal distance $f_2$ from the second lens 9 to the wavelength dispersion optical element 5, and is expressed by Expression (13).

[Math. 13]

$$L = L_1 + f_1 + L_2 + f_2 \quad (13)$$

Similarly to the above, as a specific example, in the case of determining the distance L from the semiconductor laser 10b to the wavelength dispersion optical element 5, for example, it is assumed that the distance $d_1$ is 100 mm, the oscillation wavelength width Δλ is 40 nm, the number N of grooves in the wavelength dispersion optical element 5 is 1,500/mm, the incident angle α is 43°, and the wavelength λ of the beam 112 is 915 nm. Further, in the fifth embodiment, it is assumed that the distance $L_1$ from the semiconductor laser 10b to the first beam overlapped point 152 is 100 mm, and the focal distance $f_1$ of the first lens 8 is 20 mm.

In this case, when the distance $d_1$ of 100 mm, the focal distance $f_1$ of the first lens 8 of 20 mm, and the distance $L_1$ from the semiconductor laser 10b to the first beam overlapped point 152 of 100 mm are substituted into Expression (7), the distance $d_2$ between the beam 101 and the beam 123 in the X direction after the optical axes thereof are converted to be parallel to each other is determined as 20 mm.

When those numerical values are substituted into Expressions (8) and (9), the focal distance $f_2$ from the second lens 9 to the wavelength dispersion optical element 5 is determined as about 240 mm. Note that, in this case, when the distance $d_2$ is substituted into Expression (9), the calculation is performed with the distance $d_1$ in the expression replaced with the distance $d_2$.

In addition, when those numerical values are substituted into Expression (13), the distance L from the semiconductor laser 10b to the wavelength dispersion optical element 5 is determined as about 620 mm. In other words, in the case where the configuration of the semiconductor laser apparatus according to the fifth embodiment is applied, the distance L from the semiconductor laser 10b to the wavelength dispersion optical element 5 needs to be about 620 mm. Note that, in this case, the distance L from the semiconductor laser 10b to the wavelength dispersion optical element 5 is calculated on the assumption that $L_2 = f_1 + f_2$ is established.

As described above, the laser apparatus according to the fifth embodiment (FIG. 14) of the present invention reduces the distance from the semiconductor laser 10 to the wavelength dispersion optical element 5 as compared to when the above-mentioned configuration of the semiconductor laser apparatus is not applied. Consequently, the entire apparatus may be greatly downsized.

Further, the beam width 301 is enlarged by the first lens 8 and the second lens 9, and hence the beam diameter of the beams overlapped on the wavelength dispersion optical element 5 is increased. Consequently, irradiation density of beams radiated to the wavelength dispersion optical element 5 may be greatly reduced, and the durability of the wavelength dispersion optical element 5, which is a significantly great issue in increasing the power of the apparatus, may be greatly enhanced.

In addition, the enlarged beam diameter of the beams overlapped on the wavelength dispersion optical element 5 means that the number of available grooves in the wavelength dispersion optical element 5 is increased, and hence the wavelength dispersibility of the wavelength dispersion optical element 5 may also be enhanced, resulting in another effect that a higher brightness of the semiconductor laser apparatus is obtained.

In this case, if $L_2 \neq f_1 + f_2$ is established, as compared to when the above-mentioned configuration of the semiconductor laser apparatus is not applied, the entire apparatus may be greatly downsized, and the beam diameter on the wavelength dispersion optical element 5 may be further enlarged, thereby being capable of exerting greater effects on improvement in durability and improvement in wavelength dispersibility. In particular, if $L_2 < f_1 + f_2$ is established, the entire apparatus may be further downsized because the distance from the semiconductor laser 10 to the wavelength dispersion optical element 5 is further reduced.

Sixth Embodiment

Figure 15A:
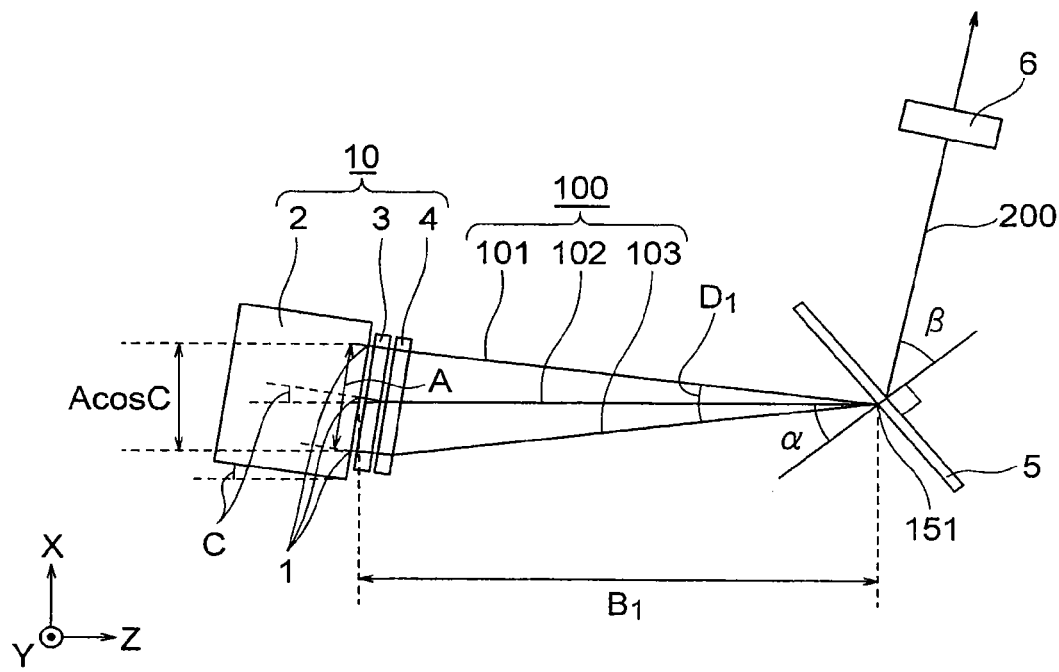
FIG. 15A is a plan view schematically illustrating a semiconductor laser apparatus according to a sixth embodiment of the present invention.
Figure 15B:
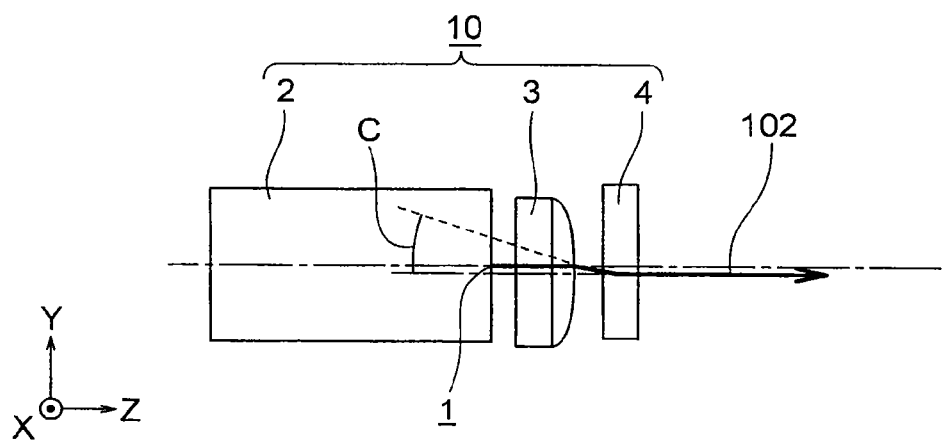
FIG. 15B is a side view schematically illustrating the semiconductor laser apparatus according to the sixth embodiment of the present invention.

FIG. 15A is a plan view schematically illustrating a semiconductor laser apparatus according to a sixth embodiment of the present invention. FIG. 15B is a side view when a semiconductor laser 10 of FIG. 15A is viewed in the X-axis direction.

In FIG. 15A, the semiconductor laser apparatus includes one semiconductor laser 10, the wavelength dispersion optical element 5, and the partial reflection mirror 6 that are described in the above-mentioned first to fourth embodiments. Note that, in the sixth embodiment, the case where one semiconductor laser 10 is used is exemplified similarly to the above-mentioned first embodiment, but the number of semiconductor lasers 10 is not limited thereto and may be at least two similarly to the above-mentioned third to fifth embodiments.

Figure 16A:
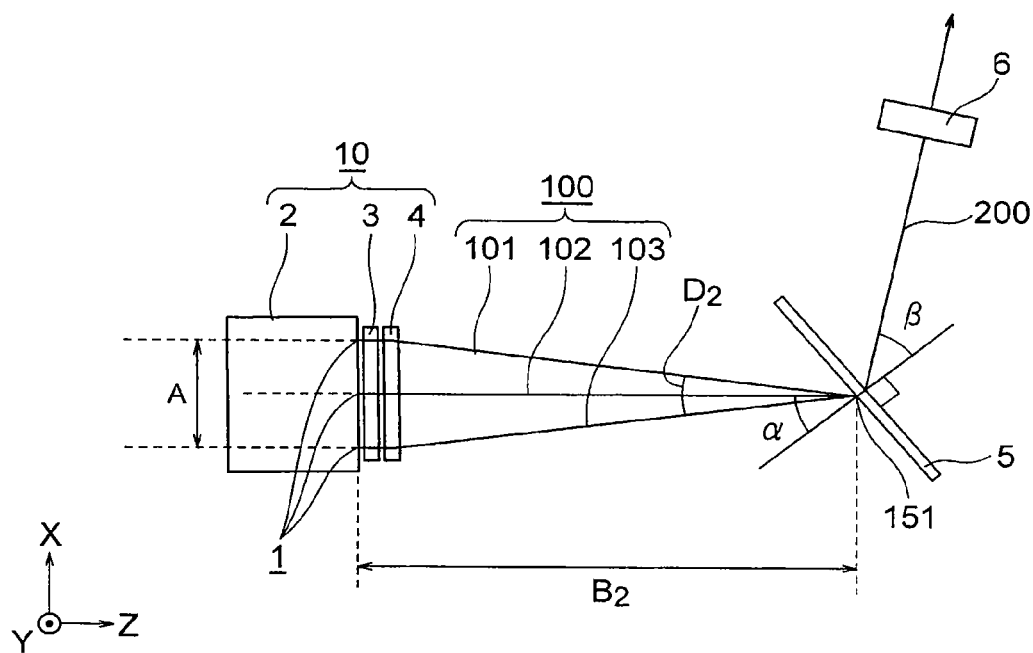
FIG. 16A is a plan view schematically illustrating a semiconductor laser apparatus used for comparison with the semiconductor laser apparatus according to the sixth embodiment of the present invention.
Figure 16B:
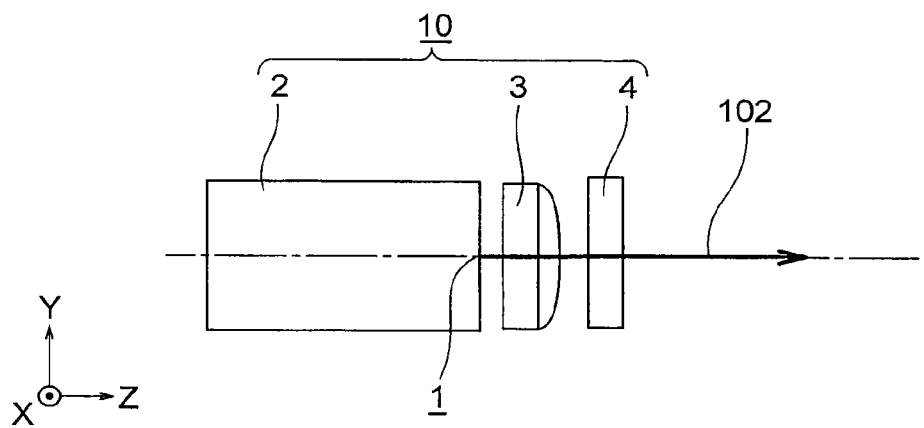
FIG. 16B is a side view schematically illustrating the semiconductor laser apparatus used for comparison with the semiconductor laser apparatus according to the sixth embodiment of the present invention.

FIG. 16A is a plan view schematically illustrating a semiconductor laser apparatus used for comparison with the semiconductor laser apparatus according to the sixth embodiment of the present invention. FIG. 16B is a side view when a semiconductor laser 10 of FIG. 16A is viewed in the X-axis direction. Note that, FIGS. 16A and 16B are referred to in order to additionally describe a difference between the semiconductor laser apparatus according to the sixth embodiment and the semiconductor laser apparatus according to the first embodiment.

In the semiconductor laser apparatus according to the sixth embodiment, as illustrated in FIG. 15A, the semiconductor laser 10 is arranged so that a plurality of emitted beams may be inclined with respect to the Z axis perpendicular to the XY plane defined by the X axis that is the slow-axis direction and the Y axis that is the fast-axis direction. In other words, as illustrated in FIG. 15A, the semiconductor laser 10 is arranged in the state of being inclined with respect to the Z axis at an inclination angle C.

Further, in FIG. 15A, the position of the beam divergence angle correction optical system 3 in the Y-axis direction is adjusted so that the beam 102, which is emitted from a light emitting point 1 positioned substantially at the center of the semiconductor laser 10, may travel substantially in parallel to the Z axis after passing through the beam rotation optical system 4.

In this case, in FIG. 15A, in order for the beam 102 after passing through the beam rotation optical system 4 to travel substantially in parallel to the Z axis, the position of the beam divergence angle correction optical system 3 in the Y-axis direction is specifically adjusted as follows.

Specifically, as illustrated in FIG. 15B, the position of the beam divergence angle correction optical system 3 in the Y-axis direction is adjusted so that the beam 102, which is emitted from the light emitting point 1 positioned substantially at the center of the semiconductor laser 10 arranged so as to be inclined with respect to the Z axis, may travel substantially in parallel to the Z axis after passing through the beam rotation optical system 4. In other words, a relative positional relationship between the light emitting point 1 and the beam divergence angle correction optical system 3 in the Y-axis direction is changed so that the beam 102 may enter the beam divergence angle correction optical system 3 at a position that is shifted substantially from the center of the beam divergence angle correction optical system 3. Then, by changing the relative positional relationship in this manner, the beam 102 after passing through the beam divergence angle correction optical system 3 may enter the beam rotation optical system 4 at the inclination angle C.

In this case, in FIG. 15A, an angle $D_1$ formed by the beam 101 and the beam 103 emitted from the semiconductor 10 is expressed by Expression (14) when the distance from the semiconductor laser 10 to the beam overlapped point 151 is represented by "distance $B_1$" and the interval between the light emitting point 1 that emits the beam 101 and the light emitting point 1 that emits the beam 103 is represented by "light emitting point interval A".

[Math. 14]

$$D_1 = \arctan\left(\frac{A \cos C}{B_1}\right) \quad (14)$$

In contrast, in the semiconductor laser apparatus according to the above-mentioned first embodiment, the semiconductor laser 10 is arranged in parallel to the Z axis as illustrated in FIG. 16A. Further, as illustrated in FIG. 16B, the beam 102 emitted from the light emitting point 1 positioned substantially at the center of the semiconductor laser 10 passes through the beam rotation optical system 4 and then travels substantially in parallel to the Z axis.

In this case, in FIG. 16A, an angle $D_2$ formed by the beam 101 and the beam 103 emitted from the semiconductor laser 10 is expressed by Expression (15) when the distance from the semiconductor laser 10 to the beam overlapped point 151 is represented by "distance $B_2$" and the light emitting point interval A is used.

[Math. 15]

$$D_2 = \arctan\left(\frac{A}{B_2}\right) \quad (15)$$

In this case, if the oscillation wavelength width of the semiconductor laser 10 of FIG. 15A and the oscillation wavelength width of the semiconductor laser 10 of FIG. 16A are equal to each other, the angle $D_1$ and the angle $D_2$ are equal to each other ($D_1$=$D_2$). Note that, the oscillation wavelength width as used herein is defined by a difference between a longest wavelength and a shortest wavelength among the wavelengths of the beams 101, 102, and 103 that oscillate at different wavelengths.

As described above, when $D_1$=$D_2$ is established, A cos C<A is established based on Expressions (14) and (15), and hence the distance $B_2$ is larger than the distance $B_1$ ($B_1$<$B_2$).

As a specific example, it is assumed that the light emitting point interval A is 10 mm, the number N of grooves in the wavelength dispersion optical element 5 is 1,500/mm, the incident angle $\alpha$ is 43°, the wavelength $\lambda$ of the beam 102 is 915 nm, the oscillation wavelength width $\Delta\lambda$ is 40 nm, and the inclination angle C is 10°.

When those numerical values are substituted into Expressions (8) and (9), the diffraction angle B is about 43.7°, the distance $B_1$ is about 118 mm, and the distance $B_2$ is about 121 mm. Note that, in this case, when the light emitting point interval A and A cos C are substituted into Expression (9), the calculation is performed with the distance $d_1$ in the expression replaced with the light emitting point interval A and A cos C.

As described above, the laser apparatus according to the sixth embodiment (FIGS. 15A and 15B) of the present invention may reduce the distance from the semiconductor laser 10 to the beam overlapped point 151 without changing the oscillation wavelength width of the semiconductor laser 10, as compared to when the above-mentioned configuration of the semiconductor laser apparatus is not applied. Consequently, the entire apparatus may be downsized with a very simple method. Besides, the effect of downsizing the entire apparatus is multiplied by the number of semiconductor lasers 10 mounted on the laser apparatus according to the sixth embodiment of the present invention, and hence a greater effect may be exerted as the number of semiconductor lasers 10 becomes larger.

The invention claimed is:

1. A semiconductor laser apparatus for overlapping wavelengths of a plurality of beams emitted from a plurality of light emitting points included in a semiconductor laser bar, the semiconductor laser apparatus comprising:
  a beam divergence angle correction optical system, which is arranged so that a relative position thereof in a beam divergence angle correction direction, which is a direction orthogonal to a direction in which the plurality of light emitting points are arranged, sequentially changes in order of arrangement of the plurality of light emitting points, the beam divergence angle correction optical system being configured to correct a divergence angle of each of the plurality of beams in the beam divergence angle correction direction;

a beam rotation optical system for rotating the each of the plurality of beams having the divergence angle corrected by the beam divergence angle correction optical system with respect to an optical axis thereof;

a wavelength dispersion optical element arranged at a focused position at which the plurality of beams transmitted through the beam divergence angle correction optical system and the beam rotation optical system are focused in a plane orthogonal to the beam divergence angle correction direction; and a partial reflection mirror arranged on an optical path of the plurality of beams that are diffracted by the wavelength dispersion optical element and overlapped on the same axis.

2. A semiconductor laser apparatus according to claim 1, wherein the plurality of light emitting points are arranged on the semiconductor laser bar at equal pitches, and wherein a difference of relative positional change amounts of the beam divergence angle correction optical systems with respect to adjacent two of the plurality of light emitting points in the divergence angle correction direction is set to a fixed value for each pair of the adjacent two of the plurality of light emitting points.

3. A semiconductor laser apparatus according to claim 1, wherein $L=F \cdot x/|\delta 1-\delta 2|$ is established, where L represents a distance from the beam divergence angle correction optical system to the focused position, F represents a focal distance of the beam divergence angle correction optical system, x represents an interval at which the plurality of light emitting points are arranged, and $\delta 1$ and $\delta 2$ represent relative positional change amounts of the beam divergence angle correction optical systems with respect to adjacent two of the plurality of light emitting points in the beam divergence angle correction direction.

4. A semiconductor laser apparatus according to claim 1, wherein the beam divergence angle correction optical system comprises a cylindrical lens, and is arranged obliquely relative to each of the plurality of light emitting points in a plane perpendicular to the optical axis of the each of the plurality of beams emitted from the plurality of light emitting points.

5. A semiconductor laser apparatus according to claim 1, wherein the semiconductor laser bar is arranged so as to emit the plurality of beams that are inclined with respect to a Z axis perpendicular to an XY plane, the XY plane being defined by an X axis that is a slow-axis direction and a Y axis that is a fast-axis direction, and wherein a position of the beam divergence angle correction optical system in a Y-axis direction is adjusted so that a beam emitted from a light emitting point positioned at a center of the semiconductor laser bar travels in parallel to the Z axis after passing through the beam rotation optical system.

6. A semiconductor laser apparatus according to claim 1, further comprising a plurality of optical systems, each comprising: the semiconductor laser bar; the beam divergence angle correction optical system; and the beam rotation optical system.

7. A semiconductor laser apparatus according to claim 6, wherein the plurality of optical systems are arranged so that beams emitted from the plurality of optical systems are focused at one point to form a beam overlapped point.

8. A semiconductor laser apparatus according to claim 6, further comprising a reflection optical element for reflecting beams emitted from each of the plurality of the optical systems to a direction toward the position of the wavelength dispersion optical element, wherein the plurality of optical systems and the reflection optical element are arranged so that the beams emitted from the plurality of optical systems are focused at one point to form a beam overlapped point.

9. A semiconductor laser apparatus according to claim 7, further comprising a first lens having a first focal distance and a second lens having a second focal distance, wherein the first lens is arranged at a position separated from the beam overlapped point by the first focal distance, and wherein the second lens is arranged at a position separated from the position of the first lens by a distance corresponding to a sum of the first focal distance and the second focal distance.

10. A semiconductor laser apparatus according to claim 8, further comprising a first lens having a first focal distance and a second lens having a second focal distance, wherein the first lens is arranged at a position separated from the beam overlapped point by the first focal distance, and wherein the second lens is arranged at a position separated from the position of the first lens by a distance corresponding to a sum of the first focal distance and the second focal distance.

11. A semiconductor laser apparatus according to claim 7, further comprising a first lens having a first focal distance and a second lens having a second focal distance, wherein the first lens is arranged at a position separated from the beam overlapped point by the first focal distance, wherein the second lens is arranged at a position separated from the position of the first lens by a distance that is smaller or larger than a distance corresponding to a sum of the first focal distance and the second focal distance, and wherein the semiconductor laser apparatus further comprises a third lens arranged between the wavelength dispersion optical element and the partial reflection mirror, or the partial reflection mirror has a mirror surface formed into a concave shape.

12. A semiconductor laser apparatus according to claim 8, further comprising a first lens having a first focal distance and a second lens having a second focal distance, wherein the first lens is arranged at a position separated from the beam overlapped point by the first focal distance, wherein the second lens is arranged at a position separated from the position of the first lens by a distance that is smaller or larger than a distance corresponding to a sum of the first focal distance and the second focal distance, and wherein the semiconductor laser apparatus further comprises a third lens arranged between the wavelength dispersion optical element and the partial reflection mirror, or the partial reflection mirror has a mirror surface formed into a concave shape.

* * * * *